United States Patent
Viss (10) Patent No.: US 8,428,898 B1
(45) Date of Patent: Apr. 23, 2013

(54) METHOD AND SYSTEM FOR CORRECTING FREQUENCY RESPONSE OF A SIGNAL SAMPLER

(75) Inventor: Marlin E. Viss, Santa Rosa, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 349 days.

(21) Appl. No.: 12/944,912

(22) Filed: Nov. 12, 2010

(51) Int. Cl.
*G01R 23/00* (2006.01)
*G06F 19/00* (2011.01)

(52) U.S. Cl.
USPC .............................. 702/75; 702/106; 702/124

(58) Field of Classification Search .................... 702/75, 702/106, 124, 190; 324/614, 624, 642; 455/67.11, 455/76
See application file for complete search history.

(56) References Cited

U.S. PATENT DOCUMENTS

| 7,260,491 | B2 * | 8/2007 | Boerstler et al. | 702/79 |
| 8,108,165 | B2 * | 1/2012 | Benmouyal | 702/75 |

* cited by examiner

*Primary Examiner* — John H Le (57) ABSTRACT

A method of filtering a signal sampled by a sampler, for example, in an equivalent time oscilloscope includes applying a correction to an actual frequency response of the sampler, with respect to a reference frequency response, to a first frequency range of the sampled signal, and transitioning across a second frequency range of the sampled signal from the correction applied to the first frequency range to no correction of the actual frequency response of the sampler, the second frequency range being higher than the first frequency range. The method further includes compensating in a third frequency range of the sampled signal for excess gain incurred while applying the correction and transitioning from the correction to no correction in the first and second frequency ranges, respectively, so that statistics of asynchronous components of the sampled signal are preserved, the third frequency range being higher than the second frequency range.

20 Claims, 6 Drawing Sheets

METHOD AND SYSTEM FOR CORRECTING FREQUENCY RESPONSE OF A SIGNAL SAMPLER

BACKGROUND

An equivalent time oscilloscope, which may be referred to as a "sampling oscilloscope," measures amplitude of a signal under test (SUT) at a sampling instant determined by a repeating trigger signal. Typically, the SUT includes a bit stream having an established length. Generally, the sampling oscilloscope takes high bandwidth samples of the bit stream of the SUT. The sampling oscilloscope displays an "eye diagram," which is a waveform representation of the bit stream over time, and displays the bit stream itself when the trigger signal is synchronous with a pattern repeat rate of the data stream.

When a sampling oscilloscope samples the SUT, deterministic components of the SUT that are synchronous with the trigger signal are accurately reproduced in the resulting waveform. For example, when the SUT has additive random noise, the statistics of the noise are accurately sampled, but the frequency of the noise is not. Similarly, when the SUT has periodic interference at a certain frequency, which is not a harmonic of the trigger signal, then the statistics of the periodic interference are accurately represented in the resulting waveform, but the frequency of the periodic interference may be changed.

Figure 1:
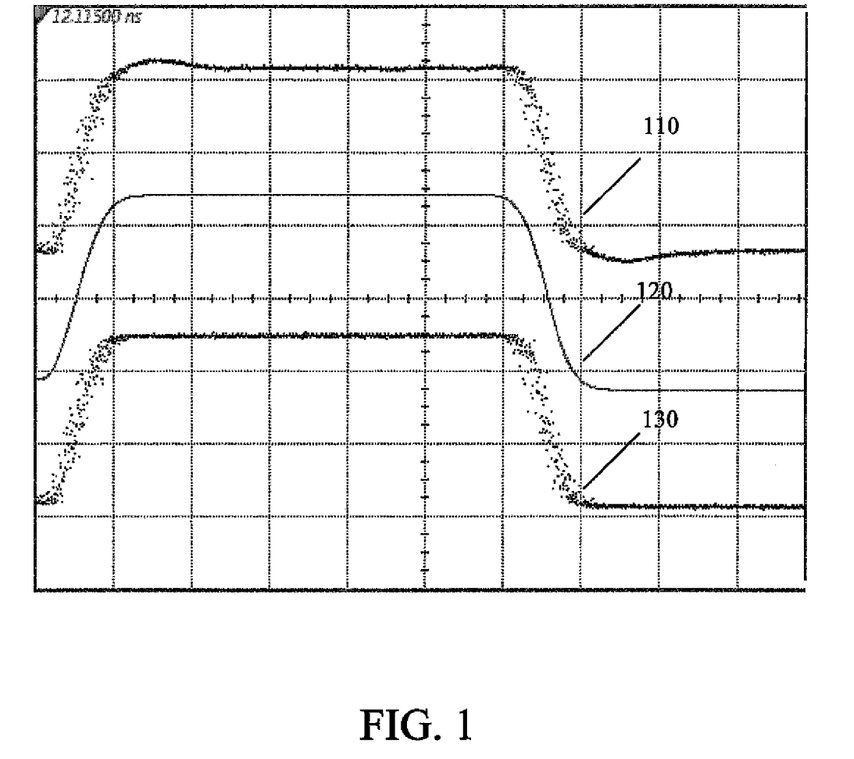
FIG. 1 shows illustrative traces provided by a conventional equivalent time oscilloscope and an equivalent time oscilloscope, according to a representative embodiment, for comparison purposes.

FIG. 1 shows illustrative traces displayed by a conventional equivalent time oscilloscope and an equivalent time oscilloscope according to a representative embodiment, for comparison purposes.

Referring to FIG. 1, trace 110 shows a portion of an NRZ signal having a data rate of 10 Gbps acquired with a conventional sampling oscilloscope. Portions of the sampled signal are not synchronous with the trigger signal, including additive noise and edge jitter, for example. The noise and jitter show up as a fuzzy envelope to the shape of the waveform. Notably, even though the actual frequency of the noise and jitter is well below the data rate of 10 Gbps, the displayed frequency of the noise and jitter appears to be much higher than the data rate. Trace 110 thus illustrates that the frequency content of the portions of the sampled SUT that are asynchronous to the trigger (e.g., the noise and jitter) are not preserved, but are aliased to much higher frequencies in the waveform.

The aliased nature of the asynchronous portions of the sampled SUT presents a problem when applying digital filters to the corresponding waveforms. For example, trace 120 of FIG. 1 depicts a case in which a 30 GHz low-pass filter is applied to the sampled SUT depicted by trace 110. Trace 120 shows that the noise and jitter envelope has been effectively removed from the waveform, and thus does not accurately depict the sampled SUT. The actual frequency of the noise and jitter is well below the 10 Gbps data rate, and therefore should not be affected by a low-pass filter with a 30 GHz cutoff. However, because the noise and jitter were aliased to frequencies well above 30 GHz, they are almost completely removed by the 30 GHz low-pass filter.

SUMMARY

In a representative embodiment, a method is provided for filtering a signal sampled by a sampler in an equivalent time oscilloscope. The method includes applying a correction with respect to a reference frequency to an actual frequency response of the sampler across a first frequency range of the sampled signal; transitioning across a second frequency range of the sampled signal from the correction applied to the first frequency range to no correction of the actual frequency response of the sampler; and compensating in a third frequency range of the sampled signal for excess gain incurred while applying the correction and transitioning from the correction to no correction in the first and second frequency ranges, respectively, so that statistics of asynchronous components of the sampled signal are preserved. The second frequency range is higher than the first frequency range, and the third frequency range is higher than the second frequency range.

In another representative embodiment, a method is provided for filtering an SUT. The method includes applying a first transfer function to a first frequency range of the sampled SUT, the first transfer function including dividing a reference frequency response of the sampler by an actual frequency response of the sampler to provide a correction of the actual frequency response of the sampler; applying a second transfer function to a second frequency range of the sampled SUT, the second transfer function including gradually removing the correction of the actual frequency response of the sampler over the second frequency range; and applying a third transfer function to a third frequency range of the sampled SUT, the third transfer function comprising compensating for excess gain incurred while applying at least one of first and second transfer functions to the first and second frequency ranges, respectively, in order to preserve statistics of the asynchronous components of the sampled SUT.

In another representative embodiment, a filter for filtering a signal sampled by a sampler in an equivalent time oscilloscope, to preserve asynchronous components of the sampled signal, includes first, second and third filter regions. The first filter region is configured to apply a correction to an actual frequency response of the sampler with respect to a reference frequency response. The second filter region is configured to gradually remove the correction of the actual frequency response of the sampler over a second frequency range, the second frequency range being higher than the first frequency range. The third filter region is configured to compensate for excess gain incurred by the first and second filter regions in order to preserve statistics of the asynchronous components of the sampled signal, the third frequency range being higher than the second frequency range.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

Generally, it is understood that the drawings and the various elements depicted therein are not drawn to scale. Further, relative terms, such as "above," "below," "top," "bottom," "upper," "lower," "left," "right," "vertical" and "horizontal," are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be "below" that element. Likewise, if the device were rotated 90 degrees with respect to the view in the drawings, an element described as "vertical," for example, would now be "horizontal."

Various representative embodiments provide filtering a signal under test (SUT), sampled by a sampler in an equivalent time oscilloscope or other device requiring sampling of a SUT waveform, using a digital filter having multiple filter regions corresponding to multiple frequency ranges of the sampled SUT. Generally, the filter regions apply different transfer functions to different frequency ranges of the sampled SUT, respectively, to transition the applied frequency response of the sampler from a reference frequency response (applied at least in the pass band of the digital filter) to an actual frequency response (with no correction), and to compensate for excess gain. For example, a first transfer function applied to a first (lowest) frequency range provides a correction of the actual frequency response of the sampler to approximate the reference frequency response; a second transfer function applied to a second frequency range provides a smooth or gradual transition from the correction to no correction of the actual frequency response of the sampler; and a third transfer function applied to a third frequency range (highest) compensates for excess gain incurred applying the first and second transfer functions. In an embodiment, a fourth transfer function of a forth additional filter region may be applied to a fourth frequency range (higher than the third frequency range) that provides no correction and a predetermined (e.g., unity) gain.

Figure 2:
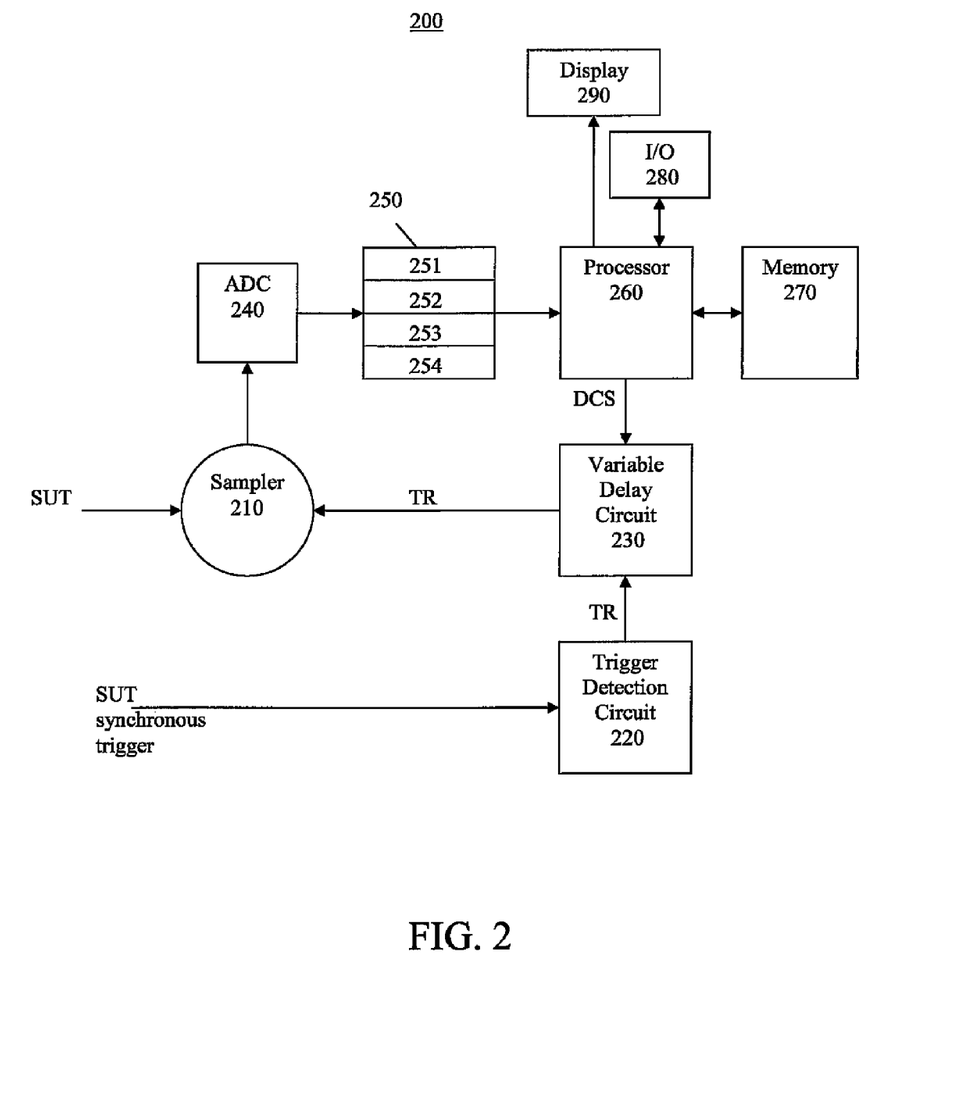
FIG. 2 is a block diagram illustrating a sampling oscilloscope including a digital filter, according to a representative embodiment.

FIG. 2 is a block diagram illustrating a sampling oscilloscope, according to a representative embodiment.

Referring to FIG. 2, sampling oscilloscope 200 includes sampler 210, trigger detection circuit 220, variable delay circuit 230 and processing unit 260. The sampler 210 receives the SUT, which has a repetitive waveform, such as a bit stream with a repetitive bit pattern. The trigger detection circuit 220 receives a trigger signal that is synchronous with the SUT. The trigger signal may be provided by a user or obtained using a hardware clock recovery module, for example. It is assumed that the SUT received by the sampler 210 includes components that are not synchronous with the trigger signal, including random or periodic interference, noise and/or jitter, such as the additive noise and edge jitter shown for example in trace 110 of FIG. 1.

The trigger detection circuit 220 detects trigger events, which may be based on rising and/or falling edges of the trigger signal, or based on predetermined voltage levels of the trigger signal. A trigger TR based on each detected trigger event is provided to the variable delay circuit 230, which delays each consecutive trigger TR by a controlled, variable amount. The sampler 210 samples the SUT in accordance with the triggers TR received from the variable delay circuit 230. Only one trigger TR pulses during each period of the repetitive waveform of the SUT, where each trigger TR is incrementally delayed so that the entire period of the repetitive waveform may be reconstructed at the sampling rate of the sampler 210 through triggers TR received from the variable delay circuit 230. The sampled SUT output by the sampler 210 thus reproduces the repetitive waveform of the SUT based on accumulation of the instantaneous samples taken from the SUT.

The ADC 240 receives the sampled SUT from the sampler 210 and provides a digitized sampled signal to the digital filter 250. The digital filter 250 provides the filtered sampled SUT to the processing unit 260 for measurement and/or analysis. The processing unit 260 also provides a delay control signal DCS to the variable delay circuit 230. The delay control signal DCS enables the amount of incremental delay added to each trigger TR by the variable delay circuit 230 to be set and/or revised based on the measurement or analysis of the digital sampled SUT, input from the user, or the like, as would be apparent to one of ordinary skill in the art.

Generally, it is desirable for the frequency response applied by a sampler (e.g., sampler 210), plus any fixtures, such as an optical-to-electrical converter, to resemble or approximate a predetermined reference frequency response, which may be referred to as an ideal frequency response, such that the resulting applied frequency response has been substantially corrected with respect to the reference frequency response. One example of a reference frequency response is a 4th order Bessel response. Another example is to make the frequency response of the sampler 210 approximate the frequency response of a desired reference or "golden" sampler. A conventional approach for making the applied frequency response of a sampler more closely resemble the reference frequency response is to characterize the actual frequency response and create a digital filter that corrects the actual frequency response to the reference frequency response based on the characterization. For example, the actual frequency response may be characterized by measuring impulse response. However, such a straightforward application of a digital filter does not accurately preserve the asynchronous components in the resulting waveform of the sampled SUT, as discussed above with reference to trace 120 in FIG. 1.

According to various embodiments, the applied frequency response of the sampler 210 is the actual frequency response substantially corrected to approximate a reference frequency response by the digital filter 250 for a first frequency range, e.g., which substantially encompasses the pass band of the digital filter 250. However, at higher frequencies of the sampled SUT, the digital filter 250 gradually transitions the applied frequency response from the correction to no correction, such that the applied frequency response is the actual frequency response of the sampler 210. The digital filter 250 also compensates for excess gain incurred during the frequency response correction operations. More particularly, in various embodiments, the digital filter 250 is implemented by multiple filter regions 251-254 corresponding to multiple frequency ranges of the digitized sampled SUT. Each of the filter regions 251-254 applies a different transfer function to the corresponding frequency range, as discussed below with reference to FIGS. 3-5.

Although depicted separately, it is understood the sampler 210, the trigger detection circuit 220, the variable delay circuit 230 and/or the digital filter 250 may be implemented, in whole or in part, by the processing unit 260, without departing form the scope of the present teachings. The processing unit 260 may include one or more processors or central processing units (CPUs), application specific integrated circuits (ASICs), field-programmable gate arrays (FPGAs), or combinations thereof, using software, firmware, hard-wired logic circuits, or combinations thereof.

The processing unit 260 is configured to execute one or more logical or mathematical algorithms, including the processing and filtering of the SUT described herein (e.g., including one or more of the various steps of FIG. 3), in conjunction with a memory 270, which may be internal to the processing unit 260. That is, the processing unit 260 may be constructed of any combination of hardware, firmware or software architectures, and memory 270 stores executable software/firmware executable code that allows the processing unit 260 to perform the various functions. In an embodiment, when the processing unit 260 is implemented as a CPU, it may execute an operating system, such as Windows operating systems available from Microsoft Corporation, NetWare operating system available from Novell, Inc., or Unix operating system available from Sun Microsystems, Inc. The operating system may also control execution of other programs of the sampling oscilloscope 200.

The memory 270 may be any number, type and combination of nonvolatile read only memory (ROM) and volatile random access memory (RAM), and stores various types of information, such as computer programs and software algorithms executable by the processor and/or CPU of the processing unit 260 (and other components). Thus, the memory 270 may include any number, type and combination of tangible computer readable storage media, such as a disk drive, an electrically programmable read-only memory (EPROM), an electrically erasable and programmable read only memory (EEPROM), a CD, a DVD, a universal serial bus (USB) drive, and the like.

The processing unit 260 may also include one or more interfaces for communicating with users, other computers and test systems, or the like. The interfaces may include one or more input/output interfaces to communicate with other computers, test systems, networks, various input devices (e.g., a keyboard, a key pad, a track ball, a mouse, a touch pad, and the like, indicated by representative I/O 280. Also, various information may be displayed on a display 290 through a display interface, which may include any type of graphical user interface (GUI).

Notably, FIG. 2 is a functional block diagram showing the illustrative sampling oscilloscope 200, according to a representative embodiment. FIG. 2 is a "functional" block diagram because it emphasizes relationships between mechanisms for accomplishing certain tasks, rather than on how the mechanisms are realized or collected into physical parts. Some of the blocks may include algorithmic tasks performed by the processing unit 260 on data in the memory 270.

Figure 3:
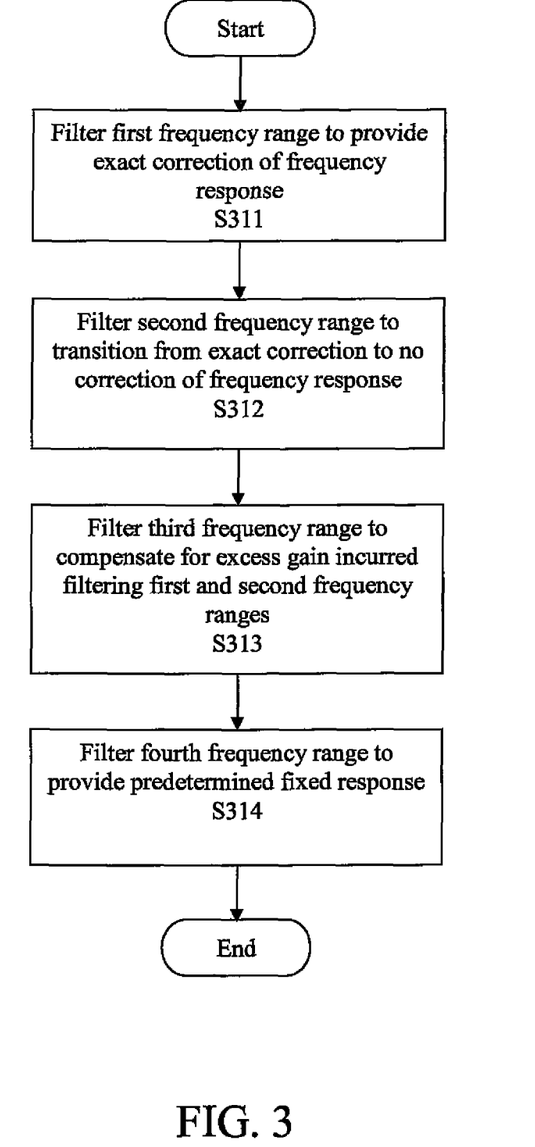
FIG. 3 is a flowchart illustrating a method for correcting frequency response of a sampler in a sampling oscilloscope using a digital filter, according to a representative embodiment.
Figure 4:
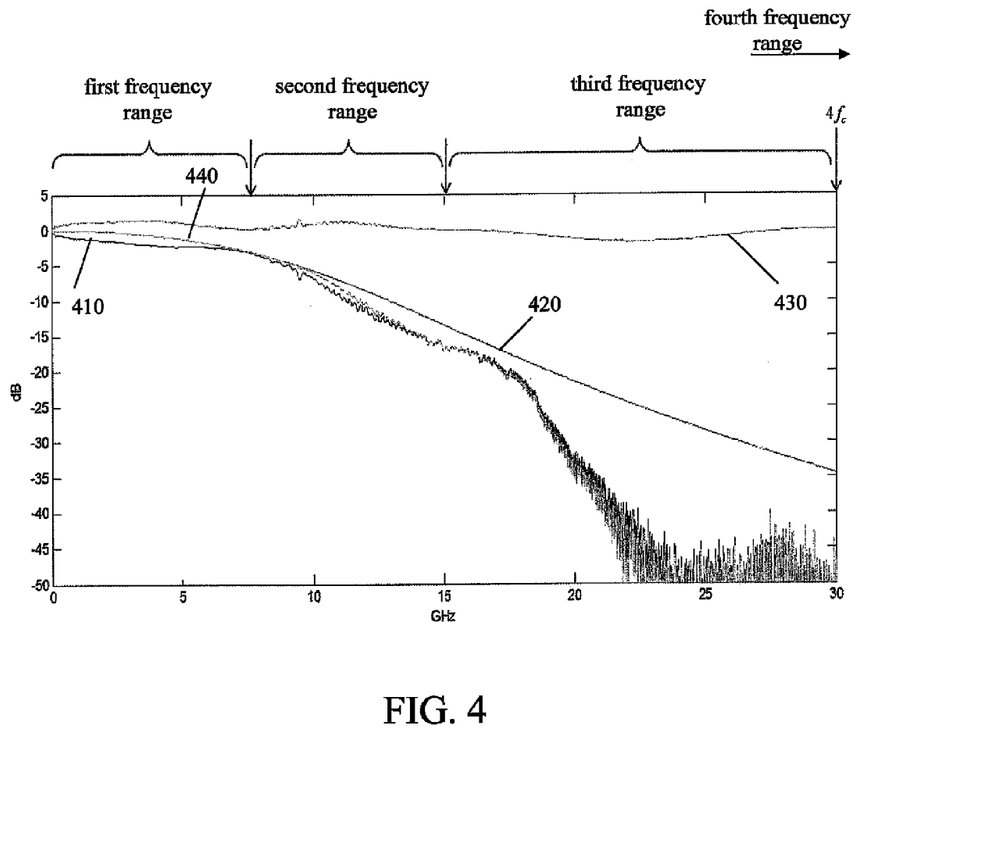
FIG. 4 shows illustrative traces corresponding to actual, reference and applied frequency responses of a sampler in a sampling oscilloscope, according to a representative embodiment.

The functionality of the digital filter 250 is described below with reference to FIGS. 3 and 4. FIG. 3 is a flowchart illustrating a method for correcting sampler frequency response in a sampling oscilloscope, and FIG. 4 shows illustrative traces corresponding to actual, reference and applied frequency responses of a sampler in a sampling oscilloscope, according to a representative embodiment. Notably, although the operations of FIG. 3 are depicted in a particular order, it is understood that all or part of the operations may occur substantially simultaneously or in different orders, without departing from the scope of the present teachings.

Initially, the digital filter 250 receives the digitized, sampled SUT from the ADC 240. Referring to FIG. 3, a first frequency range of the sampled signal is filtered in operation S311 by a first filter region 251 of the digital filter 250 in accordance with a first transfer function. The first transfer function corrects the actual frequency response of the sampler 210, so that it approximates or is substantially the same as a reference frequency response, thus correcting the actual frequency response with reference to the reference frequency response. In an embodiment, the first transfer function includes dividing the reference frequency response by the actual frequency response to provide a correction of the actual frequency response of the sampler 210 as the applied frequency response. Thus, the first filter region 251 may be referred to as the "correction region."

In an embodiment, the first frequency range extends from DC to a predetermined cutoff frequency of the reference frequency response, and corresponds to the pass band of the digital filter 250. For example, referring to FIG. 4, the first frequency range is depicted as extending from DC to about 7.5 GHz, which is about the 3 dB cutoff frequency of the reference frequency response. As discussed above, the reference frequency response may be a 4th order Bessel response, for example, in which case the first transfer function ($H_1(f)$) is provided by Equation (1), as follows:

$$H_1(f) = \frac{H_{bessel}(f)}{H_{actual}(f)} \quad \text{Equation (1)}$$

Trace 410 in FIG. 4 depicts a measured actual frequency response of the sampler 210, e.g., where the sampled SUT is not filtered by the digital filter 250. For example, the trace 410 may correspond to trace 110 in FIG. 1. Trace 420 in FIG. 4 depicts a representative reference frequency response of the sampler 210 as it would appear after being filtered by a filter having the reference frequency response, such as a $4^{th}$ order Bessel response, for example. As can be seen, the trace 410 depicting the actual frequency response drops below the trace 420 depicting the reference frequency response throughout most of the first frequency range.

In operation S312, a second frequency range of the sampled SUT is filtered by a second filter region 252 of the digital filter 250 in accordance with a second transfer function. The second transfer function provides a smooth transition across the second frequency range from the correction to no correction of the actual frequency response of the sampler 210. In an embodiment, the second transfer function includes dividing the reference frequency response by a frequency varying representation of the actual frequency response of the sampler 210 to gradually remove the correction of the actual frequency response of the of the sampler 210 (i.e., the first transfer function) as frequency increases about the predetermined cutoff frequency. Thus, the second filter region 252 may be referred to as the "transition region."

In an embodiment, the second frequency range may extend from the predetermined cutoff frequency of the reference frequency response to twice the predetermined cutoff frequency of the reference frequency response. For example, referring to FIG. 4, the second frequency range is depicted as extending from about 7.5 GHz to about 15 GHz. When the reference frequency response is assumed to be a 4th order Bessel response, for example, the second transfer function ($H_2O$) is provided by Equation (2), as follows:

$$H_2(f) = \frac{H_{bessel}(f)}{w(f)H_{actual}(f) + (1 - w(f))H_{bessel}(f)} \quad \text{Equation (2)}$$

$$\text{where } w(f) = 0.5\left(1 + \cos\left(\pi\frac{f - f_c}{f_c}\right)\right)$$

Thus, in the depicted example, the variable $w(f)$ is equal to 1 at the cutoff frequency $f_c$ (at the beginning of the second frequency range), such that the second transfer function is $H_{bessel}(f)/H_{actual}(f)$, providing the correction applied to the first frequency range. The amount of correction then decreases gradually across the second frequency range until the variable $w(f)$ is equal to 0 at twice the cutoff frequency $2f_c$ (at the end of the second frequency range), such that the second transfer function is $H_{bessel}(f)/H_{bessel}(f)$, which is equal to one and therefore provides no correction.

In operation S313, a third frequency range of the sampled SUT is filtered by a third filter region 253 of the digital filter 250 in accordance with a third transfer function. In an embodiment, the third transfer function compensates for excess gain incurred by the first and second filter regions 251 and 252 when filtering the first and second frequency ranges, respectively. In order to preserve statistics of components of the sampled SUT that that are asynchronous to the trigger signal, such as random or periodic interference, noise and/or jitter, the average magnitude of the frequency response of the digital filter 250 should be 1.0 or unity. This prevents amplification and/or attenuation of the asynchronous components. The third filter region 253 accomplishes this by determining the excess gain from the first and second filter regions 251 and 252, and then removing the excess gain with a smoothly varying magnitude response of the digital filter 250. The third transfer function provides no correction to the actual frequency response of the sampler 210. Thus, the third filter region 253 may be referred to as the "excess gain compensation region."

In an embodiment, the third frequency range may extend from the twice the predetermined cutoff frequency of the reference frequency response to four times the predetermined cutoff frequency of the reference frequency response. For example, referring again to FIG. 4, the third frequency range is depicted as extending from about 15 GHz to about 30 GHz, and the third transfer function ($H_3(f)$) is provided by Equation (3), as follows:

$$H_3(f) = 1 + \text{excess}\left(1 - \cos\left(\pi\frac{f - f_c}{f_c}\right)\right) \quad \text{Equation (3)}$$

Thus, in the depicted example, the third transfer function compensates for excess gain incurred by the in the first and second filter regions 251 and 252, such that the average gain across the digital filter 250 is equal to one. Notably, the third transfer function compensates only for the magnitude of the excess gain, and not the phase, which has reached its final value.

Trace 430 of FIG. 4 depicts the actual magnitude of the digital filter 250 across the first through third frequency ranges. In the third frequency range, trace 430 shows a dip in magnitude, which compensates for the higher magnitude applied in the first frequency range, for example, where the actual frequency response of the sampler 210, depicted by trace 410, drops below the reference frequency response, depicted by trace 420. This higher magnitude is determined to represent excess gain, for which the third filter region compensates by decreasing the magnitude throughout much of the third frequency range.

In operation S314, a fourth frequency range of the digitized sampled signal is filtered by a fourth filter region 254 of the digital filter 250 in accordance with a fourth transfer function, which simply provides a predetermined fixed frequency response of the sampler 210. For example, the fourth transfer function of the fourth filter region may simply be equal to one, in which case the fourth filter region 254 does not filter the digitized sampled signal. Thus, the fourth filter region 254 may be referred to as the "no correction region."

In an embodiment, the fourth frequency range extends from above four times the predetermined cutoff frequency of the reference frequency response. Thus, as shown in FIG. 4, the fourth filter region is depicted as extending beyond about 30 GHz, and the fourth third transfer function ($H_4(f)$) is equal to 1.0. Therefore, the sampled signal in the fourth frequency range is output from the fourth filter region with a magnitude of one and a phase of zero.

Trace 440 of FIG. 4 depicts the applied frequency response of the digital filter 250 using the first through fourth filter regions 251-254, as discussed above. As shown, the applied frequency response depicted by trace 440 is substantially the same as the reference frequency response depicted by trace 420 in the first frequency range (e.g., the pass band) filtered by the first filter region 251. The applied frequency response depicted by trace 440 then gradually transitions to substantially coincide with the actual frequency response depicted by trace 410 in the second frequency range filtered by the second filter region 252. The applied frequency response depicted by trace 440 and the actual frequency response depicted by trace 410 then remain substantially the same through the third frequency region, in which the third filter region 253 compensates for excess gain, but otherwise provides no correction to the actual frequency response of the sampler 210. The applied frequency response depicted by trace 440 and the actual frequency response depicted by trace 410 likewise remain substantially the same through the fourth frequency region, in which the fourth filter region 254 provides no gain compensation and no correction of the actual frequency response of the sampler 210. Accordingly, the asynchronous components in the waveform of the sampled signal are preserved. These statistics are preserved sufficiently to enable measurement of the asynchronous components.

The results of applying the digital filter 250, according to a representative embodiment, are shown by trace 130 in FIG. 1, which may correspond to trace 440 of FIG. 4. As shown, the digital filter 250 has changed the shape of the waveform, making it more closely match the waveform provided by a conventional low-pass filter shown by trace 120. However, trace 130 shows that the random noise and jitter envelope has not been removed from the waveform. Accordingly, the digital filter 250 successfully preserves statistics of components of the sampled SUT that that are asynchronous to the trigger signal.

Figure 5:
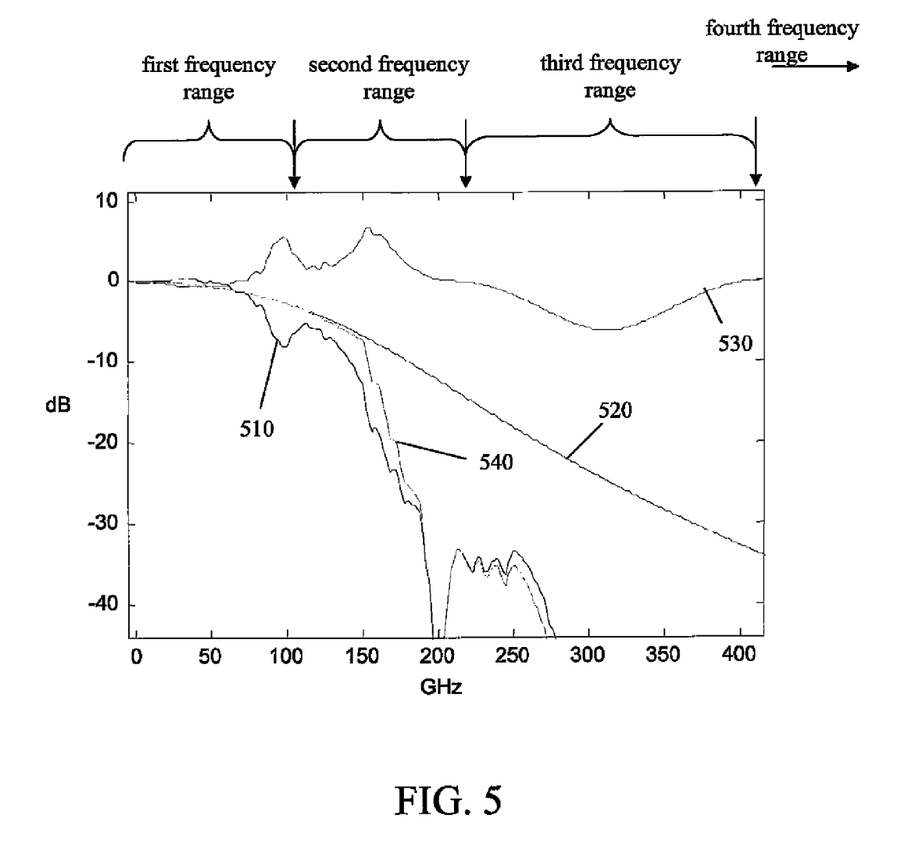
FIG. 5 shows illustrative traces corresponding to actual, reference and applied frequency responses of a sampler in a sampling oscilloscope, according to a representative embodiment.

FIG. 5 shows illustrative traces corresponding to actual, reference and applied frequency responses of a sampler in a sampling oscilloscope, according to a representative embodiment. FIG. 5 is similar to FIG. 4, except that the amount of correction applied by the digital filter (e.g., digital filter 250) to the actual frequency response of the sampler (e.g., sampler 210) in the first and second frequency ranges of is substantially more in FIG. 5 than in FIG. 4.

More particularly, trace 510 and trace 520 in FIG. 5 depict the actual frequency response and a representative reference frequency response of the sampler 210, respectively. As can be seen, trace 510 depicting the actual frequency response drops significantly below the trace 520 depicting the reference frequency response in portions of the first and second frequency ranges. Trace 530 depicts the actual magnitude of the digital filter 250 across the first through third frequency ranges. In the third frequency range, trace 530 shows a large dip in magnitude, which compensates for relatively high "spikes" in magnitude of the digital filter 250 in the first and second frequency ranges, where the actual frequency response of the sampler 210, depicted by trace 510, drops significantly below the reference frequency response, depicted by trace 520. Generally, the magnitude of the dip in the third frequency range offsets the combined magnitude of the spikes in the first and second frequency ranges, thus compensating for the excess gain in the first and second filter regions, as discussed above. Trace 540 depicts the resulting applied frequency response.

Figure 6:
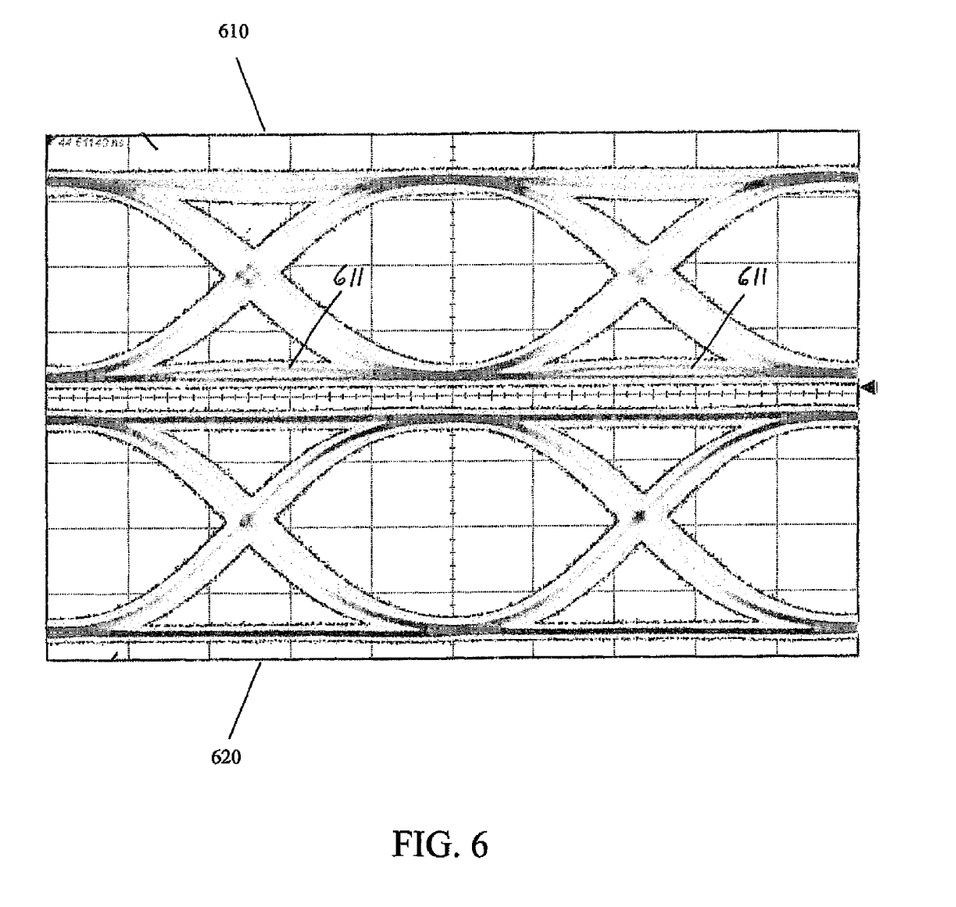
FIG. 6 shows illustrative eye diagrams of a sampled signal under test obtained by a sampling oscilloscope with no filter and with a digital filter according to a representative embodiment, respectively.

FIG. 6 shows illustrative eye diagrams of a sampled SUT obtained by a sampling oscilloscope with no filter and with a digital filter according to a representative embodiment, respectively.

In particular, eye diagram 610 is a sampled SUT obtained by a sampling oscilloscope with no filter. As shown, the eye diagram 610 includes bi-modal characteristics 611, which have been introduced through operation of the sampling oscilloscope. In comparison, eye diagram 620 is the sampled SUT after application of a digital filter, according to a representative embodiment, as discussed above. The eye diagram 620 includes no bi-modal characteristics as a result of the filtering, although the random or periodic interference, noise and jitter remain.

While specific embodiments are disclosed herein, many variations are possible, which remain within the concept and scope of the invention. Such variations would become clear after inspection of the specification, drawings and claims herein. The invention therefore is not to be restricted except within the scope of the appended claims.

What is claimed is:

1. A method of filtering a signal sampled by a sampler, the method comprising:
    applying a correction with respect to a reference frequency response to an actual frequency response of the sampler across a first frequency range of the sampled signal;
    transitioning across a second frequency range of the sampled signal from the correction applied to the first frequency range to no correction of the actual frequency response of the sampler, the second frequency range being higher than the first frequency range; and
    compensating in a third frequency range of the sampled signal for excess gain incurred while applying the correction and transitioning from the correction to no correction in the first and second frequency ranges, respectively, so that statistics of asynchronous components of the sampled signal are preserved, the third frequency range being higher than the second frequency range.

2. The method of claim 1, wherein the excess gain is incurred while applying the correction to the first frequency range and transitioning from the correction to no correction in the second frequency range.

3. The method of claim 1, wherein the asynchronous components of the sampled signal comprise at least one of random or periodic interference, noise and jitter.

4. The method of claim 1, further comprising:
    applying a predetermined fixed response of the sampler to a fourth frequency range, which is higher than the third frequency range.

5. The method of claim 4, wherein the predetermined fixed response of the sampler is unity.

6. The method of claim 1, wherein applying the correction to the actual frequency response of the sampler comprises dividing the reference frequency response by the actual frequency response of the sampler.

7. A method of filtering a signal under test (SUT) sampled by a sampler, the method comprising:
    applying a first transfer function to a first frequency range of the sampled SUT, the first transfer function comprising dividing a reference frequency response of the sampler by an actual frequency response of the sampler to provide a correction of the actual frequency response of the sampler;
    applying a second transfer function to a second frequency range of the sampled SUT, the second transfer function comprising gradually removing the correction of the actual frequency response of the sampler over the second frequency range; and
    applying a third transfer function to a third frequency range of the sampled SUT, the third transfer function comprising compensating for excess gain incurred while applying at least one of first and second transfer functions to the first and second frequency ranges, respectively, in order to preserve statistics of the asynchronous components of the sampled SUT.

8. The method of claim 7, wherein the second frequency range is higher than the first frequency range, and the third frequency range is higher than the second frequency range.

9. The method of claim 8, further comprising;
    applying a fourth transfer function to a fourth frequency range of the sampled SUT, the fourth transfer function providing a predetermined fixed response of the sampler, the fourth frequency range being higher than the third frequency range.

10. The method of claim 9, wherein the predetermined fixed response of the sampler is unity.

11. The method of claim 7, wherein the reference frequency response of the sampler is a 4th order Bessel response.

12. The method of claim 7, wherein the first frequency range extends from DC to a predetermined cutoff frequency of the reference frequency response of the sampler.

13. The method of claim 12, wherein the predetermined cutoff frequency is about a 3 dB cutoff frequency of the reference frequency response.

14. The method of claim 12, where the second frequency range extends from the predetermined cutoff frequency of the reference frequency response of the sampler to twice the predetermined cutoff frequency of the reference frequency response of the sampler.

15. The method of claim 14, where the third frequency range extends from twice the predetermined cutoff frequency of the reference frequency response of the sampler to four times the predetermined cutoff frequency of the reference frequency response of the sampler.

16. The method of claim 7, wherein gradually removing the correction of the actual frequency response of the sampler comprises dividing the reference frequency response of the sampler by a frequency varying representation of the actual frequency response of the sampler to gradually remove the correction of the actual frequency response of the sampler.

17. The method of claim 7, wherein excess gain comprises gain incurred filtering the first and second frequency ranges exceeding unity, and compensating for the excess gain comprises adjusting an average magnitude of the gain incurred filtering the first and second frequency ranges to be unity.

18. The method of claim 17, wherein adjusting the average magnitude of the gain comprises:
   determining the excess gain incurred from applying the first and second transfer functions to the first and second frequency ranges; and
   varying a magnitude response to remove the determined excess gain.

19. A filter for filtering a signal sampled by a sampler in an equivalent time oscilloscope, to preserve asynchronous components of the sampled signal, the filter comprising:

a first filter region configured to apply a correction to an actual frequency response of the sampler with respect to a reference frequency response;

a second filter region configured to gradually remove the correction of the actual frequency response of the sampler over a second frequency range, the second frequency range being higher than the first frequency range; and a third filter region configured to compensate for excess gain incurred by the first and second filter regions in order to preserve statistics of the asynchronous components of the sampled signal, the third frequency range being higher than the second frequency range.

20. The filter of claim 19, further comprising;
a fourth first filter region configured to providing a fixed response of the sampler over a fourth frequency range, the fourth frequency range being higher than the third frequency range.

* * * * *

UNITED STATES PATENT AND TRADEMARK OFFICE
CERTIFICATE OF CORRECTION

PATENT NO. : 8,428,898 B1
APPLICATION NO. : 12/944912
DATED : April 23, 2013
INVENTOR(S) : Marlin E. Viss Page 1 of 1

It is certified that error appears in the above-identified patent and that said Letters Patent is hereby corrected as shown below:

In the Specifications

In column 10, line 42, In Claim 9, delete "comprising;" and insert -- comprising: --, therefor.

In column 12, line 15, In Claim 20, delete "comprising;" and insert -- comprising: --, therefor.

In column 12, line 16, In Claim 20, after "fourth" delete "first".

Signed and Sealed this
Twenty-fifth Day of June, 2013

Teresa Stanek Rea
*Acting Director of the United States Patent and Trademark Office*